(12) United States Patent
Chang et al.

(10) Patent No.: US 8,455,095 B2
(45) Date of Patent: Jun. 4, 2013

(54) ARTICLE AND METHOD FOR MANUFACTURING SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW); Juan Zhang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 138 days.

(21) Appl. No.: 13/010,947

(22) Filed: Jan. 21, 2011

(65) Prior Publication Data

US 2012/0045640 A1    Feb. 23, 2012

(30) Foreign Application Priority Data

Aug. 20, 2010   (CN) .......................... 2010 1 0258943

(51) Int. Cl.
*B32B 7/02* (2006.01)
*C23C 14/06* (2006.01)
*C23C 14/35* (2006.01)

(52) U.S. Cl.
USPC ........... 428/336; 428/698; 428/332; 428/632; 428/627; 428/432

(58) Field of Classification Search
None
See application file for complete search history.

(56) References Cited

U.S. PATENT DOCUMENTS

| | | | |
|---|---|---|---|
| 4,714,660 A * | 12/1987 | Gates, Jr. | 428/698 |
| 7,455,918 B2 * | 11/2008 | Gates et al. | 428/701 |
| 7,887,935 B2 * | 2/2011 | Elkouby et al. | 428/697 |
| 8,080,312 B2 * | 12/2011 | Mcnerny et al. | 428/216 |
| 8,221,838 B2 * | 7/2012 | Gates et al. | 427/255.391 |
| 2005/0202283 A1 * | 9/2005 | Gates et al. | 428/698 |
| 2006/0177584 A1 * | 8/2006 | Gates et al. | 427/255.34 |
| 2007/0298232 A1 * | 12/2007 | McNerny et al. | 428/216 |
| 2008/0240876 A1 * | 10/2008 | Elkouby et al. | 407/119 |
| 2008/0260947 A1 * | 10/2008 | Gates et al. | 427/255.394 |

OTHER PUBLICATIONS

Selbmann et al. J. Phys. IV France, C2, vol. 2, 1991, 587-592.*
Gates. J. Vac Science A4, 1986, 2707-2712.*

* cited by examiner

*Primary Examiner* — Jennifer McNeil
*Assistant Examiner* — Vera Katz
(74) *Attorney, Agent, or Firm* — Altis Law Group, Inc.

(57) ABSTRACT

An article includes a substrate; and a color layer deposited on the substrate, wherein the color layer has an L* value between about 28 to about 32, an a* value between about −1 to about 1, and a b* value between about −1 to about 1 in the CIE L*a*b* color space.

4 Claims, 2 Drawing Sheets

ARTICLE AND METHOD FOR MANUFACTURING SAME

CROSS-REFERENCE TO RELATED APPLICATIONS

The present application is related to co-pending U.S. patent application Ser. Nos. 13/010,957, 13/010,693, 13/010,975, entitled "ARTICLE AND METHOD FOR MANUFACTURING SAME", by Zhang et al. These applications have the same assignee as the present application and have been concurrently filed herewith. The above-identified applications are incorporated herein by reference.

BACKGROUND

1. Technical Field

The exemplary disclosure generally relates to articles and methods for manufacturing the articles.

2. Description of Related Art

Vacuum deposition is used to form a thin film or coating on housings of portable electronic devices, to improve abrasion resistance. However, typical vacuum deposition can not deposit absolute black coatings on the housing.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary embodiment of an article and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
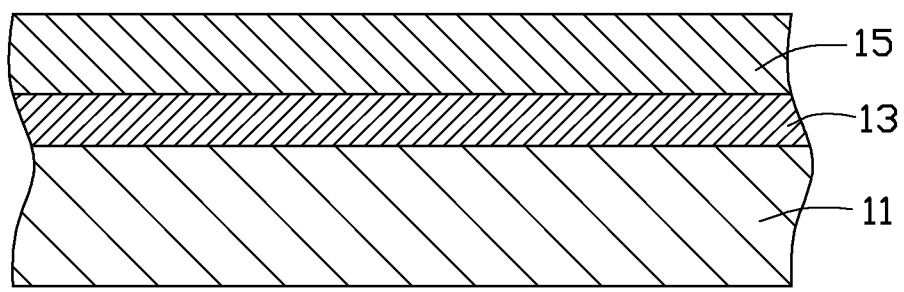
FIG. 1 illustrates a cross-sectional view of an exemplary embodiment of an article.
Figure 2:
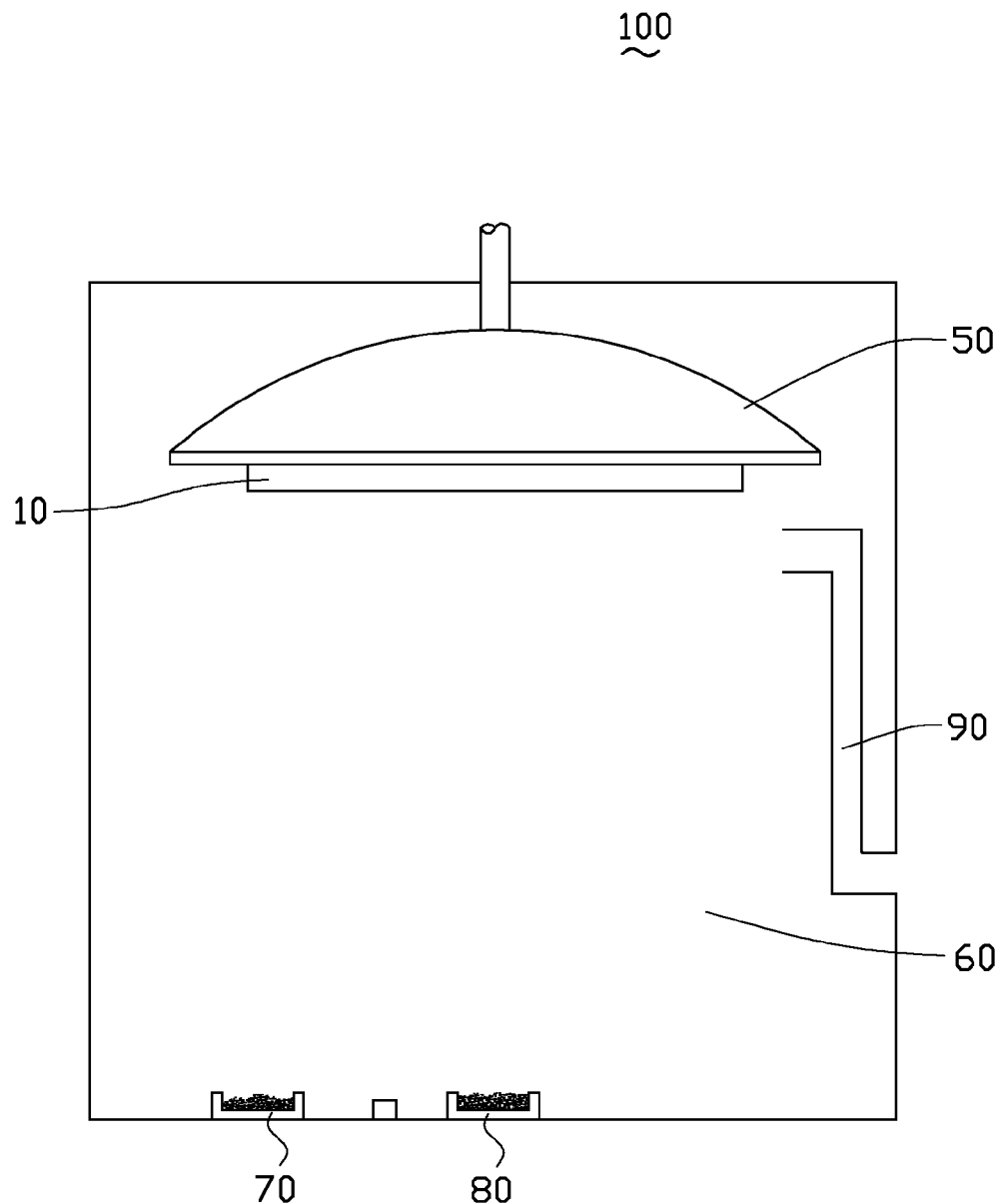
FIG. 2 is a schematic view of a magnetron sputtering coating machine for manufacturing the article in FIG. 1.

Referring to FIG. 1, an exemplary embodiment of an article 10 manufactured, by a coating process, such as by vacuum deposition, and includes a substrate 11, a bonding layer 13 deposited on the substrate 11 and a color layer 15 deposited on the bonding layer 13 opposite to the substrate 11. The article 10 may be a housing of an electronic device. The substrate 11 may be made of metal, glass, plastic or ceramic.

The bonding layer 13 is formed between the substrate 11 and the color layer 15 for improving the binding force between the substrate 11 and the color layer 15. The bonding layer 13 may be made of titanium. The bonding layer 13 has a thickness ranging from about 0.01 micrometers to about 0.1 micrometers, and in this exemplary embodiment has a thickness of about 0.05 micrometers. The bonding layer 13 in this exemplary embodiment has a color that does not affect the color of the color layer 15, such as silver, white, or gray.

The color layer 15 is a titanium aluminum oxide-carbon layer. The color layer 15 has an L* value between about 28 to about 32, an a* value between about −1 to about 1, and a b* value between about −1 to about 1 in the CIE L*a*b* (CIE LAB) color space, so the color layer 15 is absolute black. The color layer 15 has a thickness ranging from about 0.3 micrometers to about 1 micrometer.

A method for manufacturing the article 10 manufactured by vacuum deposition may include at least the following steps.

A substrate 11 is provided. The substrate 11 may be made of metal, glass, plastic or ceramic.

The substrate 11 is pretreated. For example, the substrate 11 may be washed with a solution (e.g., alcohol or acetone) in an ultrasonic cleaner, to remove, e.g., grease, dirt, and/or impurities. The substrate 11 is then dried. The substrate 11 may also be cleaned using argon plasma cleaning. The substrate 11 is retained on a rotating bracket 50 in a vacuum chamber 60 of a magnetron sputtering coating machine 100. The vacuum level of the vacuum chamber 60 is adjusted to 8.0×10−3 Pa. Pure argon is fed into the vacuum chamber 60 at a flux of about 300 Standard Cubic Centimeters per Minute (sccm) to 600 sccm from a gas inlet 90. A bias voltage is applied to the substrate 11 in a range from −300 to −800 volts for about 5 to about 10 min. The substrate 11 may then be washed by argon plasma, to further remove any contaminants. Thus, the binding force between the substrate 11 and the color layer 15 is enhanced.

The bonding layer 13 is deposited on the substrate 11 by magnetron sputtering. The temperature in the vacuum chamber 60 is adjusted to be in a range from 50 degrees Celsius (° C.) to 180° C., i.e., the reaction temperature is about 50 to about 180° C.; argon is fed into the vacuum chamber 60 at a flux from about 10 sccm to about 200 sccm from the gas inlet 90, i.e. the reaction gas for depositing the bonding layer 13 is argon. The speed of the rotating bracket 50 is adjusted to be in a range from 1 revolution per minute (rpm) to 4 rpm. A titanium target 70 in the vacuum chamber 60 is evaporated at a power from about 5 kW to about 11 kW and a bias voltage is applied to the substrate 11 in a range from about −50 to about −200 volts for about 3 min to about 10 min, to deposit the bonding layer 13 on the substrate 11.

The color layer 15 is deposited on the bonding layer 13 by magnetron sputtering. The temperature in the vacuum chamber 60 is kept between about 50° C. to about 180° C., i.e., the reaction temperature is about 50° C. to about 180° C. The argon is continuously fed into the vacuum chamber 60 at a flux from about 100 sccm to about 200 sccm from the gas inlet 90. Oxygen is fed into the vacuum at a flux from 15 sccm to 20 sccm and ethylene is fed into the vacuum at a flux from 15 sccm to 20 sccm from the gas inlet 90, i.e, the reaction gas for depositing the color layer 15 is ethylene and oxygen. The substrate is rotated about 1 rpm to about 4 rpm. The titanium target 70 and a aluminum target 80 in the vacuum chamber 60 are simultaneously evaporated at a power from about 5 kW to about 11 kW; a bias voltage is applied to the substrate 11 is in a range from about −50 volts to about −200 volts for about 10 min to about 60 min, to deposit the color layer 15 on the bonding layer 13.

The color layer 15 is absolute black which has an L* value between about 28 to about 32, an a* value between about −1 to about 1, and a b* value between about −1 to about 1 in the CIE L*a*b* (CIE LAB) color space.

To form the color layer 15 in the above exemplary embodiment, the titanium target 70 and the aluminum target 80 are employed, and by adjusting the flux of the reaction gas, i.e., adjusting the flux of ethylene and oxygen, to change the composition of the color layer 15. So the color of the color layer 15 has an L* value between about 28 to about 32, an a* value between about −1 to about 1, and a b* value between about −1 to about 1 in the CIE L*a*b* (CIE LAB) color space, thereby an absolute black colored article is produced.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
   a substrate;
   a bonding layer formed on the substrate, the bonding layer being a titanium layer consisting of Ti; and
   a color layer deposited on the bonding layer, the color layer is a titanium aluminum oxide-carbon layer, wherein the color layer has an L* value between about 28 to about 32, an a* value between about −1 to about 1, and a b* value between about −1 to about 1 in the CIE L*a*b* color space.

2. The article as claimed in claim 1, wherein the color layer has a thickness ranging from about 0.3 micrometers to about 1 micrometers.

3. The article as claimed in claim 1, wherein the bonding layer has a thickness ranging from about 0.01 micrometers to about 0.1 micrometers.

4. The article as claimed in claim 1, wherein the substrate is made of metal, glass, plastic or ceramic.

* * * * *